(12) United States Patent
Dhandapani et al.

(10) Patent No.: US 12,451,380 B2
(45) Date of Patent: Oct. 21, 2025

(54) SEMICONDUCTOR FABRICATION USING PROCESS CONTROL PARAMETER MATRIX

(71) Applicant: Applied Materials, Inc., Santa Clara, CA (US)

(72) Inventors: Sivakumar Dhandapani, San Jose, CA (US); Jun Qian, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2163 days.

(21) Appl. No.: 16/137,009

(22) Filed: Sep. 20, 2018

(65) Prior Publication Data

US 2019/0096722 A1    Mar. 28, 2019

Related U.S. Application Data

(60) Provisional application No. 62/562,997, filed on Sep. 25, 2017.

(51) Int. Cl.
*H01L 21/67* (2006.01)
*B24B 37/005* (2012.01)
(Continued)

(52) U.S. Cl.
CPC ...... *H01L 21/67253* (2013.01); *B24B 37/005* (2013.01); *B24B 37/20* (2013.01);
(Continued)

(58) Field of Classification Search
CPC ......... H01L 21/67253; H01L 21/32312; H01L 22/12; H01L 22/20; H01L 22/26;
(Continued)

(56) References Cited

U.S. PATENT DOCUMENTS 6,439,964 B1  8/2002 Prahbu et al.
6,540,591 B1  4/2003 Pasadyn et al.
(Continued)

FOREIGN PATENT DOCUMENTS

CN        1554118       12/2004
JP     2006-043873       2/2006
(Continued)

OTHER PUBLICATIONS

Bae et al., "Effect of Retainer Pressure on Removal Profile and Stress Distribution in Oxide CMP", Nov. 19-21, 2009, International Conference on Planarization/CMP Technology, Fukuoka, 5 pages.
(Continued)

*Primary Examiner* — Makena S Markman
(74) *Attorney, Agent, or Firm* — Fish & Richardson P.C.

(57) ABSTRACT

A method of processing substrates includes: subjecting each respective first substrate of a first plurality of substrates to a process that modifies a thickness of an outer layer of the respective first substrate; generating a plurality of groups of process parameter values, wherein the plurality of process parameters comprise a plurality of control parameters and a plurality of state parameters; generating a plurality of measured removal profiles; generating a matrix that relates the plurality of process parameters to a calculated removal profile; for each respective second substrate of a second plurality of substrates, determining a target removal profile and a plurality of state parameter values; calculating respective control parameter values to apply to the respective second substrate by applying the target removal profile and the state parameter values to the matrix; and subjecting each respective second substrate to the process using the respective process parameter values.

16 Claims, 3 Drawing Sheets

(51) Int. Cl.
*B24B 37/20* (2012.01)
*B24B 37/32* (2012.01)
*H01L 21/321* (2006.01)
*H01L 21/66* (2006.01)

(52) U.S. Cl.
CPC .......... *B24B 37/32* (2013.01); *H01L 21/3212* (2013.01); *H01L 22/12* (2013.01); *H01L 22/20* (2013.01); *H01L 22/26* (2013.01)

(58) Field of Classification Search
CPC ................. H01L 21/3212; H01L 22/10; H01L 21/67011; B24B 37/005; B24B 37/20; B24B 37/32; B24B 37/013; B24B 37/04; B24B 37/042; B24B 37/10; B24B 49/00; B24B 49/02; B24B 49/03; B24B 49/04; B24B 49/05
USPC .................................. 451/5, 8, 9, 10, 11, 41
See application file for complete search history.

(56) References Cited

U.S. PATENT DOCUMENTS

| | | | |
|---|---|---|---|
| 6,544,103 | B1 | 4/2003 | Korovin |
| 6,932,671 | B2 | 8/2005 | Korovin et al. |
| 7,115,017 | B1 | 10/2006 | Laursen et al. |
| 7,160,739 | B2 | 1/2007 | Shanmugasundram et al. |
| 7,822,500 | B2 | 10/2010 | Kobayashi et al. |
| 8,246,417 | B2 | 8/2012 | Kobayashi et al. |
| 8,396,582 | B2 | 3/2013 | Kaushal et al. |
| 8,774,958 | B2 | 7/2014 | Zhang et al. |
| 9,213,340 | B2 | 12/2015 | Zhang et al. |
| 2002/0193899 | A1 | 12/2002 | Shanmugasundram et al. |
| 2003/0027424 | A1* | 2/2003 | Paik ....................... B24B 37/042 438/692 |
| 2004/0023606 | A1 | 2/2004 | Wang et al. |
| 2005/0006344 | A1* | 1/2005 | Tanaka ............... H01J 37/32935 156/345.24 |
| 2005/0070205 | A1 | 3/2005 | Korovin et al. |
| 2006/0009127 | A1 | 1/2006 | Sakurai |
| 2007/0102116 | A1* | 5/2007 | Shanmugasundram ..................... H01L 22/20 700/121 |
| 2008/0119119 | A1 | 5/2008 | Zuniga et al. |
| 2010/0138026 | A1 | 6/2010 | Kaushal et al. |
| 2012/0129431 | A1 | 5/2012 | Hui et al. |
| 2012/0277897 | A1* | 11/2012 | Zhang .................. G05B 19/182 700/103 |
| 2013/0237128 | A1 | 9/2013 | David et al. |
| 2016/0096251 | A1 | 4/2016 | Zhang et al. |

FOREIGN PATENT DOCUMENTS

| | | |
|---|---|---|
| TW | 200607604 | 3/2006 |
| TW | 200822204 | 5/2008 |
| WO | WO 01/32363 | 5/2001 |
| WO | WO 2008/032753 | 3/2008 |

OTHER PUBLICATIONS

International Search Report and Written Opinion in International Application No. PCT/US2018/052009, mailed on Jan. 17, 219, 10 pages.

* cited by examiner

SEMICONDUCTOR FABRICATION USING PROCESS CONTROL PARAMETER MATRIX

CROSS-REFERENCE TO RELATED APPLICATIONS

This application claims priority to U.S. Application Ser. No. 62/562,997, filed on Sep. 25, 2017, the entire disclosure of which is incorporated by reference.

TECHNICAL FIELD

The present disclosure relates to controlling an integrated circuit fabrication process, e.g., a chemical mechanical polishing process.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For some applications, the filler layer is planarized until the top surface of a patterned layer is exposed. For example, a conductive filler layer can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, the filler layer is planarized until a predetermined thickness is left over an underlying layer. For example, a dielectric layer deposited can be planarized for photolithography.

Chemical mechanical polishing (CMP) is one accepted method of planarization. This planarization method typically requires that the substrate be mounted on a carrier head. The exposed surface of the substrate is typically placed against a rotating polishing pad with a durable roughened surface. The carrier head provides a controllable load on the substrate to push it against the polishing pad. A polishing liquid, such as a slurry with abrasive particles, is typically supplied to the surface of the polishing pad. The processed wafer exhibits a material removal profile, a two dimensional map of the change in a polished layer's thickness after the polishing process.

SUMMARY

In one aspect, a method of processing substrates includes subjecting each respective first substrate of a first plurality of substrates to a process that modifies a thickness of an outer layer of the respective first substrate, for each respective first substrate recording a plurality of process parameter values of a plurality of process parameters used for the process thus generating a plurality of groups of process parameter values, for each respective first substrate, measuring a removal profile of the outer layer during or after the process with a monitoring system thus generating a plurality of measured removal profiles, generating a matrix that relates the plurality of process parameters to a calculated removal profile, for each respective second substrate of a second plurality of substrates determining a target removal profile and a plurality of state parameter values, for each respective second substrate calculating respective control parameter values to apply to the respective second substrate by applying the target removal profile and the state parameter values to the matrix, and subjecting each respective second substrate to the process using the respective process parameter values. The plurality of process parameters include a plurality of control parameters and a plurality of state parameters. Generating the matrix includes finding matrix values that best fit the plurality of groups of process parameter values to the plurality of measured removal profiles.

In another aspect, a computer program product for controlling processing of a substrate, the computer program product tangibly embodied in a non-transitory computer readable medium, may include instructions for causing a processor to: generate a matrix that relates a plurality of process parameters to a calculated removal profile, wherein generating the matrix comprises finding matrix values that best fit a plurality of groups of process parameter values to a plurality of measured removal profiles; obtain a target removal profile and a plurality of state parameter values for each respective substrate of a plurality of substrates; for each respective substrate, calculate respective control parameter values to apply to the respective substrate by applying the target removal profile and the state parameter values to the matrix; and cause a semiconductor processing system to subject each respective substrate to the process using the respective process parameter values.

In yet another aspect, a polishing system may include: a support to hold a polishing pad; a carrier head to hold a substrate in contact with the polishing pad, the carrier head having a plurality of chambers; a motor to generate relative motion between the support and the carrier head; and a controller configured to: generate a matrix that relates a plurality of process parameters to a calculated removal profile, wherein generating the matrix comprises finding matrix values that best fit a plurality of groups of process parameter values to a plurality of measured removal profiles, wherein the process parameter values comprise state parameter values and control parameter values, and wherein the control parameter values comprise pressures for the chambers in the carrier head; obtain a target removal profile and a plurality of state parameter values for each respective substrate of a plurality of substrates; for each respective substrate, calculate respective control parameter values to apply to the respective substrate by applying the target removal profile and the state parameter values to the matrix, wherein the respective control parameter values comprise respective pressures for the chambers in the carrier head; and cause a semiconductor processing system to subject each respective substrate to the process using the respective process parameter values.

Implementations may include one or more of the following features.

An initial matrix that relates the plurality of process parameters to a calculated removal profile may be stored. Control parameters for each respective first substrate may be calculated by applying a target removal profile and state parameter values to the initial matrix.

The process may include chemical mechanical polishing. The control parameter values may include pressures of chambers in a carrier head to hold a substrate against a polishing pad, a platen rotation rate, carrier head rotation rate, or polishing time. The state parameter values may include one or more of a retaining ring life, or a polishing pad life.

The monitoring system may include an in-situ monitoring system. Each respective second substrate may be monitored during processing with an in-situ monitoring system and modifying the respective process parameter values based on data from the in-situ monitoring system. The determining of the target removal profile may include storing a desired thickness profile, receiving a measured thickness profile of the respective second substrate, and determining a difference between the measured thickness profile and the desired thickness profile.

Certain implementations may have one or more of the following advantages. Control parameter convergence may be achieved more rapidly. Within-wafer thickness non-uniformity and wafer-to-wafer thickness non-uniformity (WIWNU and WTWNU) may be reduced. Product wafers may be used for model refinement, leading to the actual profile of processed substrates being closer to a desired profile.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

One challenge in CMP is generating a process model in matrix formulation that is able to predict a material removal profile as a function of multiple input parameters. Input parameters may include variations in the initial thickness of a substrate layer, a target material removal profile, the polishing pad condition, the retaining ring condition, the relative speed between the polishing pad and a substrate, and the applied pressure on a substrate. Such a process model can enable control of a CMP process to achieve a target material removal profile.

Figure 1:
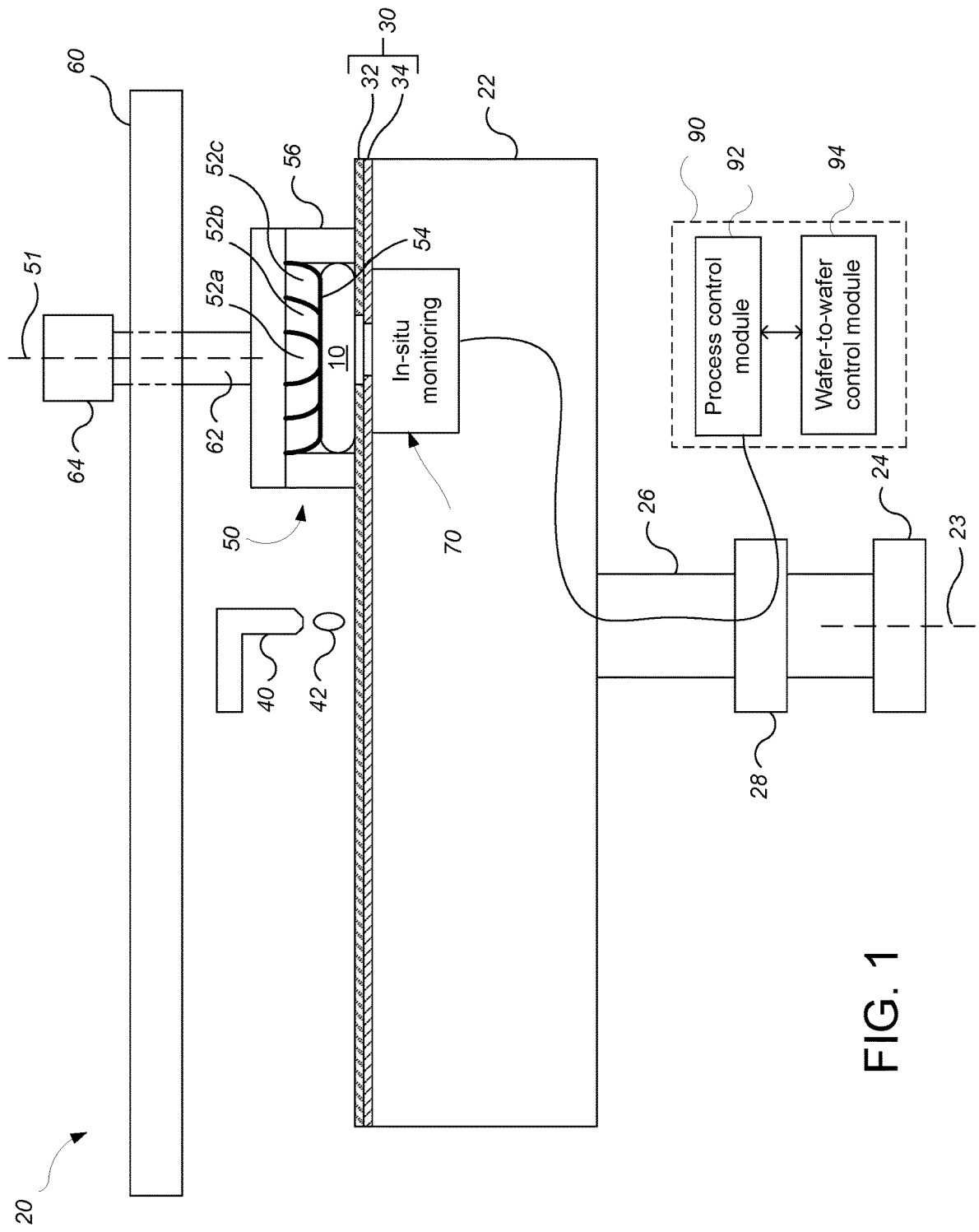
FIG. 1 illustrates a schematic cross-sectional view of an example of a polishing apparatus.

FIG. 1 illustrates an example of a polishing apparatus 20. The polishing apparatus 20 can include a rotatable disk-shaped platen 22 on which a polishing pad 30 is situated. The platen is operable to rotate about an axis 23. For example, a motor 24 can turn a drive shaft 26 to rotate the platen 22. The polishing pad 30 can be detachably secured to the platen 22, for example, by a layer of adhesive. The polishing pad 30 can be a two-layer polishing pad with an outer polishing layer 32 and a softer backing layer 34.

The polishing apparatus 20 can include a polishing liquid supply port 40 to dispense a polishing liquid 42, such as an abrasive slurry, onto the polishing pad 30. The polishing apparatus 20 can also include a polishing pad conditioning disc to abrade the polishing pad 30 to maintain the polishing pad 30 in a consistent abrasive state.

Figure 2:
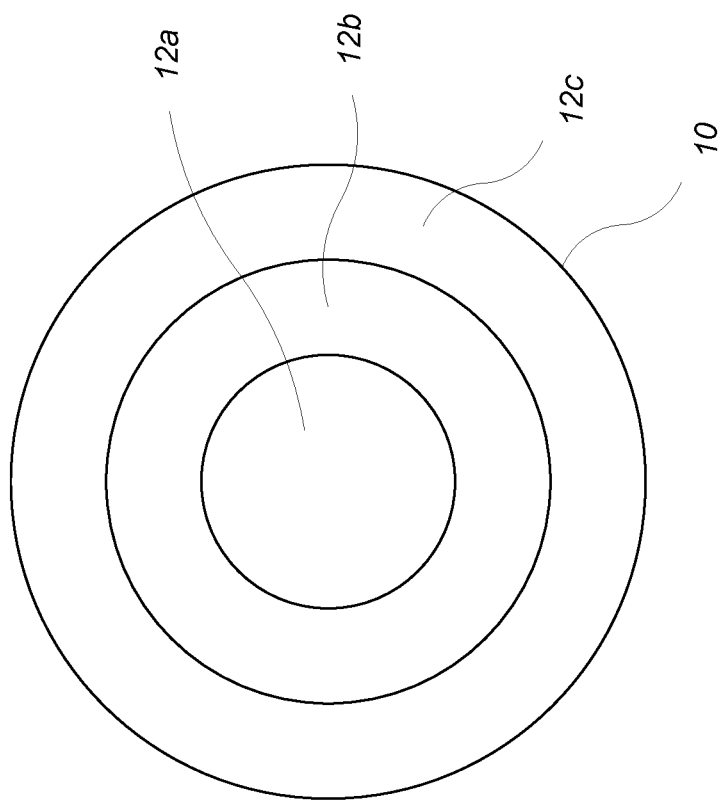
FIG. 2 illustrates a schematic top view of a substrate having multiple zones.

A carrier head 50 is operable to hold a substrate 10 against the polishing pad 30. Each carrier head 50 also includes a plurality of independently controllable pressurizable chambers, e.g., three chambers 52a-52c, which can apply independently controllable pressurizes to associated zones 12a-12c on the substrate 10 (see FIG. 2). Referring to FIG. 2, the center zone 12a can be substantially circular, and the remaining zones 12b-12c can be concentric annular zones around the center zone 12a.

Returning to FIG. 1, the chambers 52a-52c can be defined by a flexible membrane 54 having a bottom surface to which the substrate 10 is mounted. The carrier head 50 can also include a retaining ring 56 to retain the substrate 10 below the flexible membrane 54. Although only three chambers are illustrated in FIGS. 1 and 2 for ease of illustration, there could be two chambers, or four or more chambers, e.g., five chambers. In addition, other mechanisms to adjust the pressure applied to the substrate, e.g., piezoelectric actuators, could be used in the carrier head 50.

Each carrier head 50 is suspended from a support structure 60, e.g., a carousel or track, and is connected by a drive shaft 62 to a carrier head rotation motor 64 so that the carrier head can rotate about an axis 51. Optionally each carrier head 50 can oscillate laterally, e.g., on sliders on the carousel, by motion along or track; or by rotational oscillation of the carousel itself. In operation, the platen 22 is rotated about its central axis 23, and the carrier head 50 is rotated about its central axis 51 and translated laterally across the top surface of the polishing pad 30.

The polishing apparatus can include an in-line monitoring system for measuring a thickness of a polished layer upon completion of the polishing process. For example, the in-line monitoring system can generate a map of layer thicknesses over the zones 12a-12c. The measurements from the in-line monitoring system can be communicated to a controller 90. Examples of the in-line monitoring system include an optical monitoring system, e.g., a spectrographic monitoring system.

A spectrographic monitoring system can measure a layer thickness value and an associated goodness of fit (GOF) value for each points of the layer thickness map. For example, a broadband light source can be used to illuminate a location on the layer, and the reflection containing an optical interference spectrum created by the layer, the substrate, and any other layers in between the two can be measured. The measured optical interference spectrum can be analyzed, for example, by fitting it with an equation that describes an optical interference spectrum generated by an expected stacking of films. The fitting produces a determination of the thickness of the layer and a GOF value that is indicative of how closely the measured spectrum agrees with the expected film stack. As such, the GOF value can be used as an indicator of reliability of the determined thickness value.

The controller 90 contains a tool control module 92 and an integrated advanced process control module (i-APC) 94. The tool control module 92 and the i-APC module 94 in combination may provide advanced process control functionalities, such as wafer-to-wafer uniformity control. The controller 90 can be a computing device that includes a microprocessor, memory and input/output circuitry, e.g., a programmable computer. Although illustrated with a single block, the controller 90 can be a networked system with functions distributed across multiple computers, and modules 92 and 94 can be located in the same computer or different computers.

The described polishing apparatus has many associated process parameters that control the operation of the polishing apparatus or describe the state of the apparatus or the polishing environment. Process parameters that control the operation of the polishing apparatus (and that can be set, at least initially, by the tool control module 92) (control parameters') include the following: rotation rate of platen 22; rotation rate of carrier head 50; pressure of the chambers 52a-52c; and polishing time.

Process parameters that reflect the state of the apparatus or polishing environment ('state parameters') include the following: polishing retaining ring life; polishing pad life; polishing pad conditioning disc life; type of polishing pad; and type of polishing liquid ('slurry'). The retaining ring, pad, and conditioning disc are examples of consumable components ('consumables') within a polishing apparatus. The condition or 'life' of these consumables can be described, for example, as a count of wafers processed; actual wafer polishing time; or total time elapsed since installation.

A typical wafer to be polished by a CMP process has a layer of material with surface topologies to be planarized. A goal of the CMP process is to achieve a desired material removal profile, which is a one or two dimensional map of the change in a polished layer's thickness after the polishing process. The surface topologies vary from wafer-to-wafer due to different die designs having different underlying transistor and interconnect patterns, e.g. due to different pattern densities. These factors interact with the CMP process in a complex manner, which results in different polishing behavior between wafers with different die designs. Furthermore, even wafers with the same die design may have different polishing behaviors due to upstream process variations in deposition or etching. Therefore, different CMP control parameters are typically needed, at least for wafers with different die designs, and possibly for individual wafers with the same die design, to achieve a desired material removal profile. Material removal profiles sometimes have a radial dependence partly due to the axial symmetry and rotation of the polishing head. Accordingly, one control parameter that is often tuned to achieve a desired radial profile is the pressures of the radial chambers 52a-52c.

The polishing apparatus 20 can implement a wafer-to-wafer control. The wafer-to-wafer control can provide improved likelihood of achieving target material removal profiles over a wide range of designs and wafer non-uniformities. A wafer-to-wafer feedback control method uses information about previously processed substrates to improve processing of a subsequent substrate. The wafer-to-wafer feedback control method can be implemented in the i-APC module 94.

In an example implementation of the controller 90, the i-APC module 94 generates an initial set of control parameter values based on an initial process model, e.g., an initial matrix, and provides the initial set of control parameters values to the tool control module 92. The tool control module 92 can then control the polishing system using the received control parameter values.

After processing of one or more substrates over a user defined period of time, data about the substrates can be used by the i-APC module 94 to improve the initial process model by generating a new process model or updating the initial process model. For example, the user defined period of time for generation of a new process model or updating of the initial process model can be measured in number of substrates polished, such as 5, 10, 25, or 100 wafers, or a "lot" of wafers (wafers are typically transported and processed in "lots"; a typical lot size is 25 wafers). As another example, the user defined period of time may be defined as a portion of a lifetime of a consumable, such as a polishing pad lifetime. Such generation or updating of the model can be performed off-line, or independent of the operation of the polishing apparatus.

The improved process model can then be used to generate an improved set of control parameter values for a subsequent substrate. Improvement of the process model by the i-APC module 94 can lead to improved polishing uniformity control by minimizing error between the target material removal profile and the actual profile realized on the substrate.

The i-APC module 94 performs tasks including collecting and processing of data from processed wafers to improve processing of future wafers. Collected data can include upstream and downstream metrology data of the product wafers from various wafer metrology tools ("monitoring systems"). Upstream metrology data may include thickness map and associated GOF values of a deposited layer. Downstream metrology data may include a thickness map and associated GOF values of the polished layer, or surface roughness values. The GOF values can be used by the i-APC module 94 to determine whether the thickness value are reliable enough to be used in the process model development. The i-APC module 94 pairs these data with the control and state parameters used during the processing of a particular wafer, and stores it in a data log. The data log may be organized in variety of ways, including grouping by wafer ID, design ID, lot ID, tool ID, etc. This data log is typically used to monitor trends and drifts in the behavior of a CMP process and to take corrective actions. Due to their size, data logs may be stored in one or more servers that are a part of the controller 90.

In some implementations, the i-APC module 94 stores a desired thickness profile for each wafer to be processed. Using the desired thickness profile, the i-APC module 94 can generate the target material removal profile by subtracting a desired thickness profile from the thickness map of the deposited layer.

A process model can be generated in various ways. For example, a process model for describing the effects of chamber pressures can be generated by processing multiple blanket wafers, which are un-patterned wafers with a uniform layer of a film to be polished, as a proxy for product wafers that have patterns. By polishing the blanket wafers for a fixed amount of time and measuring the resulting material removal profile, a relationship between a set of chamber pressures and a material removal rate can be determined using the Preston equation.

The Preston Equation States:

$$\text{Material removal rate (MRR)} = K_p * v * p \quad \text{(Equation 1)}$$

where v is the velocity of the polishing pad surface with respect to the substrate surface being polished, p is the pressure applied to a radial zone of a wafer to be polished against the polishing pad, and $K_p$ is a proportionality constant known as the Preston coefficient. The velocity, pressure, and polish time are known and controlled variables, so $K_p$ of each zone can be determined with algebraic manipulations. The resulting set of Preston equations containing the determined Preston coefficients is an example of a process model.

The foregoing discussion of the Preston equation (Equation 1) relates velocity and pressure of a particular zone 12 of the substrate 10 to the material removal rate of that particular zone. In practice, the pressures of other zones of the substrate 10 can have a cumulative effect on the removal rate of the particular zone. Such effects are called crosstalks, and crosstalks can be modeled, for example, using a matrix formulation of the following form:

$$A = \begin{pmatrix} k_{11} & k_{12} & \cdots & k_{1n} \\ k_{21} & k_{22} & \cdots & k_{2n} \\ \vdots & \vdots & \cdots & \vdots \\ k_{m1} & k_{m2} & \cdots & k_{mn} \end{pmatrix},$$

where $k_{xy}$ represents an effective Preston coefficient of the $y^{th}$ zone to the $x^{th}$ zone. The matrix A is called a Preston coefficient matrix. The diagonal terms, where subscripts x and y are the same, e.g., $k_{11}$, correspond to the original Preston coefficients for each zones in absence of crosstalk. The non-diagonal terms represent the effects of the other $y^{th}$ zones, or crosstalks, on the $x^{th}$ zone. For example, $k_{12}$ correspond to the effect of $2^{nd}$ zone on the material removal rate of the $1^{st}$ zone.

Using the Preston coefficient matrix A, the material removal rates for the different zones of a substrate can be modeled by the following equation:

Material removal rate $(R)=A*P*V_{eff}$ (Equation 2)

where P is a column vector of pressures $p_y$ for each zones of the substrate:

$$P = \begin{pmatrix} p_1 \\ p_2 \\ \vdots \\ p_n \end{pmatrix},$$

where R is a column vector of material removal rates $r_x$ of each zones of the substrate:

$$R = \begin{pmatrix} r_1 \\ r_2 \\ \vdots \\ r_m \end{pmatrix},$$

and $V_{eff}$ is the effective, or average, velocity of the polishing pad surface with respect to all zones of the substrate. Due to the rotation of the carrier head, the use of an effective velocity for all zones is typically a good approximation. In some implementations, by fixing the rotation rate of the platen, the respective velocities of the different zones can be factored into the respective Preston coefficients of the matrix A. The resulting vector R of material removal rates now incorporates the effects of the crosstalks from the other zones.

The matrix A containing Preston coefficients from polishing of blanket wafers is an example of a baseline process model. The i-APC module 94 can then use this baseline process model to generate a set of initial control parameters for processing of subsequent product wafers. While a process model for modeling effects of chamber pressures are discussed, process models for other control parameters can be generated in this manner.

Due to the differences in surface topologies between a blanket wafer and a product wafer, however, the baseline process model might not achieve the target material removal profile on the polished product wafer. In such case, the i-APC 94 attempts to find, through multiple iterations over polishing of multiple product wafers, a set of correction factors ("offsets") for improving the achieved material removal profile on the product wafers. The i-APC module 94 eventually determines, or converges on, offsets that can be used with the baseline process model for polishing the product wafer. However, such the determination of the offsets can take polishing of multiple product wafers, during which the polished wafers are less likely to meet the target removal profile thus more likely to be rejected, adversely impacting yield of the polishing process.

Consumption of product wafers for offset convergence should be minimized as they are valuable, expensive, and limited in quantity. One way of reducing the number of rejected product wafers until offset convergence is reached is to provide an improved process model that more completely and accurately captures the effects of various process parameters. In some implementations, the i-APC module 94 is configured to provide the improved process model. One way of improving the quality of the process model is to implement a process model that takes in as inputs (1) target material removal profile and (2) state parameters that reflect the conditions of the polishing apparatus, and outputs a set of estimated control parameters (e.g. chamber pressures) that would achieve the target material removal profile.

The material removal rate is influenced by state parameters 114 of the polishing apparatus such as the life, or age, of various consumables due to their wear. For example, the polishing pad may experience a reduction in elasticity or a reduction in surface roughness due to aging. The retaining ring may get polished away during the CMP process, becoming thinner. The polishing pad conditioning disc may become dull and have reduced capacity for pad conditioning. These changes to characteristics of the consumables can affect the polishing behavior. Therefore, wafers with an identical design may require different sets of control parameters for different state parameters to achieve the target material removal profile. Therefore, incorporating state parameters into the process model can lead to better control parameter estimation.

State parameters can be modeled using the matrix formulation by adding additional columns of coefficients to the Preston coefficient matrix A as follows:

$$B = \begin{pmatrix} k_{11} & k_{12} & \cdots & k_{1n} & s_{11} & s_{12} & \cdots & s_{1f} \\ k_{21} & k_{22} & \cdots & k_{2n} & s_{21} & s_{22} & \cdots & s_{2f} \\ \vdots & \vdots & \cdots & \vdots & \vdots & \vdots & \cdots & \vdots \\ k_{m1} & k_{m2} & \cdots & k_{mn} & s_{m1} & s_{m2} & \cdots & s_{mf} \end{pmatrix},$$

where $s_{vw}$ corresponds to the effect of $w^{th}$ state parameter on the material removal rate of $v^{th}$ zone.

Using the augmented Preston coefficient matrix B, the material removal rates for the different zones of a substrate can be modeled by the following equation:

Material removal rate $(R)=B*PA*V_{eff}$ (Equation 3)

where PA is a column vector containing state parameters in addition to the zone pressures of vector PA as follows:

$$PA = \begin{pmatrix} p_1 \\ p_2 \\ \vdots \\ p_n \\ sp_1 \\ sp_2 \\ \vdots \\ sp_f \end{pmatrix},$$

where $sp_w$ corresponds to the $w^{th}$ state parameter.

A material removal profile can be calculated using Equation 3 by multiplying the material removal rate vector R with a CMP polish duration t, resulting in Material removal profile $(RP)=B*PA*V_{eff}*t$ (Equation 4)

In some implementations, for determining the zone pressures $p_1$-$p_m$ for achieving a target removal profile given a set of state parameters $sp_1$-$sp_f$, the material removal profile vector RP is populated with the target removal profile, and the sp coefficients of the column vector PA is populated with the current set of state parameters. Then, the target zone pressures can be determined using various methods. For example, matrix inversion can be used to create a system of linear equations as follows:

$$B^{-1}*RP=I*PA*Veff*t \quad \text{(Equation 5)}$$

where $B^{-1}$ is the inverse matrix of B, and I is the identity matrix resulting from the matrix multiplication $B^{-1}*B$.

The resulting system of linear equations is an overdetermined system. In some cases, a mathematically exact solution of zone pressures $p_1$-$p_m$ may not exists. In such cases, various optimization and fitting methods can be used to determine an approximate solution. Examples of optimization methods include the least square method and gradient descent.

Various weightings can be used in the fitting process. For example, certain zones may be weighed more than other zones of a substrate. As another example, different control parameters can be given different minimum and/or maximum change per fitting iteration to limit and/or make aggressive changes to certain parameters.

In some implementations, the time t and $V_{eff}$ are fixed variables. For example, their values can be determined during baselining of a CMP process and the values can remain fixed until another baselining takes place. In some implementations, the values for time and $V_{eff}$ are supplied by an operator, by a fab host, or by the i-APC module 94.

While matrices with specific arrangements of variables have been discussed, the variables can be arranged in various ways to achieve similar results, and different matrix formulations can be created based on the foregoing discussion. For example, the foregoing variables and parameters can be arranged so that, for a coefficient matrix (CM), input vector (IV), and target pressure vector (P), $$CM*IV=P \quad \text{(Equation 6)}$$

where input vector IV consists of target removal profile RP and state parameters sp and has the following form:

$$IV = \begin{pmatrix} RP_1 \\ RP_2 \\ \vdots \\ RP_n \\ sp_1 \\ sp_2 \\ \vdots \\ sp_f \end{pmatrix}.$$

While use of various matrix formulations to model the effect of zone pressures and state parameters on the material removal profile have been discussed, other control parameters can be similarly determined.

Figure 3:
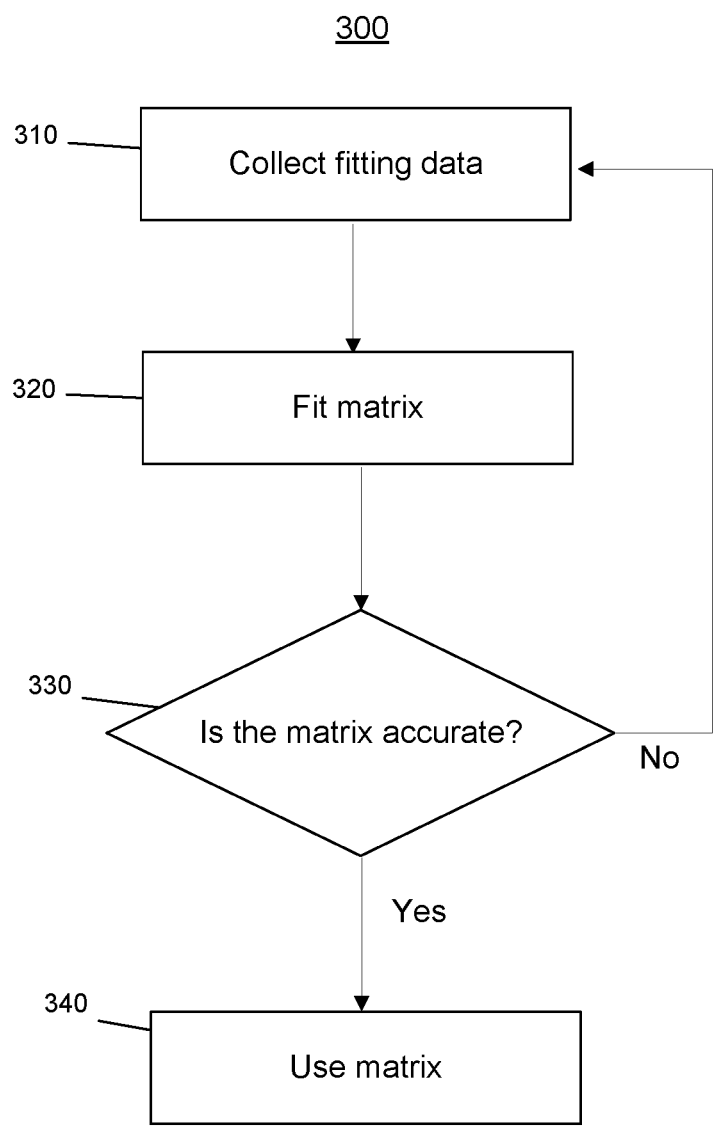
FIG. 3 illustrates an example process for using a matrix model in a CMP process.

FIG. 3 illustrates an example process 300 for generating and using a matrix model in a CMP process. The augmented Preston coefficient matrix B is an example of a matrix model. First, the wafer-to-wafer control module 94 collects fitting data (310). For example, fitting data can be collected at specified points in pad life, or collected during the entire pad life. The fitting data comprises a set of input (e.g., process parameters, target material removal profile) and output (e.g., measured material removal profile) pairs that have been measured. For example, data log maintained by wafer-to-wafer control module 94 can be used to retrieve for each substrate, the state parameters during the process; the target removal profile; the control parameters used during the process; and the measured removal profile. The retrieved information is then analyzed to determine its suitability as fitting data. In some implementations, all observed input-output pairs are used as fitting data.

In general, the CMP polish behavior may vary substantially between substrates with different designs. Therefore, it may be beneficial to further categorize the fitting data into different die designs to be used for creating design-specific matrix model.

Once a sufficient amount of such fitting examples have been collected, the fitting of the matrix can commence (320). The fitting can be performed using various algorithms such as, for example, least squares and Levenberg-Marquardt.

The wafer-to-wafer control module 94 determines whether the generated matrix model is accurate (330). After the fitting phase 320 is completed, the matrix's accuracy should be verified. Verification of the accuracy, for example, may include using the matrix to generate a set of control parameters, processing a wafer using the calculated parameters, and verifying whether the resulting material removal profile is sufficiently close to the input target material removal profile. If the calculated control parameters are not sufficiently accurate, then the process returns to step 310 to collect additional fitting data. If the output is accurate, then the matrix model is ready to be used.

As another example, the matrix model can be applied on a verification data set to verify that the generated control parameters are sufficiently close to the verification output data in response to verification input data.

The wafer-to-wafer control module 94 uses the generated matrix model (340) to generate control parameters to be used for initialization in response to target material removal profile and state parameters.

In some implementations, the accuracy of the generated matrix model is verified by using the control parameters generated using the matrix model to polish product wafers, and observing the number of wafers processed until process offsets have converged. If the number of wafers processed before offset convergence is below a predetermined value, the accuracy of the matrix model is verified.

In some implementations, individual matrix model is generated for each wafer design. In such implementations, the wafer-to-wafer control module 94 maintains a library of coefficient matrices, and the controller selects a coefficient matrix generated for the current wafer design to initialize the process.

The fitting performed to generate the coefficient matrix can be computationally intensive. Accordingly, in some implementations, generation of the coefficient matrix may be done 'off-line' while the CMP tool is undergoing maintenance. In other implementations, the fitting can be done on a separate server that is part of the controller 90. In some other implementations, the fitting can be done in a server that is not part of the controller 90, which provides the generated coefficient matrices to the controller.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. The polishing system can be a linear polishing system, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used relative orientation or positioning of the components; it should be understood that the polishing surface and substrate can be held in a vertical orientation or some other orientation with respect to gravity.

Particular embodiments of the invention have been described. Other embodiments are within the scope of the following claims.

What is claimed is:

1. A method of processing substrates, comprising:
    subjecting each respective first substrate of a first plurality of substrates to a process that modifies a thickness of an outer layer of the respective first substrate;
    for each respective first substrate, recording values of a plurality of control parameter values for a plurality of control parameters and a plurality of state parameter values for a plurality of state parameters;
    generating a plurality of groups of the plurality of control parameter values and the plurality of state parameter values;
    for each respective first substrate, measuring a removal profile of the outer layer during or after the process with a monitoring system, thus generating a plurality of measured removal profiles;
    generating a column vector comprising the plurality of control parameter values and the plurality of state parameter values;
    generating a matrix, the matrix and the column vector partially determining a calculated removal profile, wherein generating the matrix comprises finding matrix values that best fit the plurality of groups of the plurality of control parameter values and the plurality of state parameter values to the plurality of measured removal profiles;
    for each respective second substrate of a second plurality of substrates, determining a target removal profile and a plurality of state parameter values;
    for each respective second substrate, calculating respective control parameter values to use when polishing the respective second substrate, wherein calculating uses the matrix and the column vector; and
    subjecting each respective second substrate to the process using the respective control parameter values and the state parameter values.

2. The method of claim 1, wherein the matrix is an augmented matrix, and further comprising storing an initial matrix that relates the plurality of control parameters and the plurality of state parameters to a calculated removal profile.

3. The method of claim 2, comprising calculating control parameters for each respective first substrate by applying a target removal profile and state parameter values to the initial matrix.

4. The method of claim 1, wherein the process comprises chemical mechanical polishing.

5. The method of claim 4, wherein the state parameter values comprise one or more of a retaining ring life, or a polishing pad life.

6. The method of claim 4, wherein the plurality of control parameter values comprise pressures of chambers in a carrier head to hold a substrate against a polishing pad.

7. The method of claim 6, wherein the plurality of control parameter values further comprise one or more of a platen rotation rate, carrier head rotation rate, or polishing time.

8. The method of claim 1, wherein the monitoring system comprises an in-situ monitoring system.

9. The method of claim 1, wherein determining the target removal profile comprises storing a desired thickness profile, receiving a measured thickness profile of the respective second substrate, and determining a difference between the measured thickness profile and the desired thickness profile.

10. The method of claim 1, comprising monitoring each respective second substrate during processing with an in-situ monitoring system and modifying the respective control and state parameter values based on data from the in-situ monitoring system.

11. A non-transitory computer readable medium for controlling processing of a substrate, the non-transitory computer readable medium having instructions which when executed by a processor cause the processer to:
    generate a column vector comprising a plurality of control parameters and a plurality of state parameters;
    generate a matrix, a product of the matrix and the column vector partially determining a calculated removal profile, wherein generating the matrix comprises finding matrix values that best fit a plurality of groups of process parameter values and a plurality of groups of state parameter values to a plurality of measured removal profiles;
    obtain a target removal profile and a plurality of state parameter values for each respective substrate of a plurality of substrates;
    for each respective substrate, calculate respective control parameter values to use when polishing the respective substrate, wherein calculating comprises using the matrix and the column vector; and cause a semiconductor processing system to subject each respective substrate to the process using the respective control parameter values and the plurality of state parameter values.

12. The non-transitory computer readable medium of claim 11, comprising instructions for causing the processor to:
store an initial matrix that relates the plurality of control parameters and the plurality of state parameters to a calculated removal profile.

13. The non-transitory computer readable medium of claim 12, comprising instructions for causing the processor to:
calculate control parameters for each respective first substrate by applying a target removal profile and state parameter values to the initial matrix.

14. The non-transitory computer readable medium of claim 12, wherein the plurality of control parameter values comprise pressures of chambers in a carrier head to hold a substrate against a polishing pad.

15. The non-transitory computer readable medium of claim 14, wherein the plurality of control parameter values further comprise one or more of a platen rotation rate, carrier head rotation rate, or polishing time.

16. The non-transitory computer readable medium of claim 11, wherein the state parameter values comprise one or more of a retaining ring life, or a polishing pad life.

* * * * *